United States Patent [19]

Gill

[11] 4,393,092
[45] Jul. 12, 1983

[54] METHOD FOR CONTROLLING THE CONDUCTIVITY OF POLYIMIDE FILMS AND IMPROVED DEVICES UTILIZING THE METHOD

[75] Inventor: Graham P. Gill, Tempe, Ariz.

[73] Assignee: Motorola, Inc., Schaumburg, Ill.

[21] Appl. No.: 357,375

[22] Filed: Mar. 12, 1982

[51] Int. Cl.³ .......................... B05D 3/06; B05D 5/12
[52] U.S. Cl. ........................................ 427/38; 427/40; 427/41
[58] Field of Search ............................ 427/38, 41, 40

[56] References Cited

U.S. PATENT DOCUMENTS 4,199,650  4/1980  Mirtich et al. ........................ 427/38

Primary Examiner—James R. Hoffman
Attorney, Agent, or Firm—Robert M. Handy

[57] ABSTRACT

When ion bombardment milling is used to each electronic devices having metal-polymer sandwich stuctures, the ion bombardment induces conductivity in the normally insulating polymer layers, even at low (e.g. 100 eV) bombardment energies. Bombarded polymer layers can be used to produce thin film resistors. Where it is desired to reduce or eliminate the bombardment induced conductivity, this may be accomplished, for a polyimide polymer, by a brief (e.g. 30 sec) exposure to a low energy (e.g. <10 eV) plasma, or by heating for a longer period of time (e.g 2 hours at 250° C.), or by a combination thereof. It is desirable that the plasma contain oxygen.

20 Claims, 11 Drawing Figures

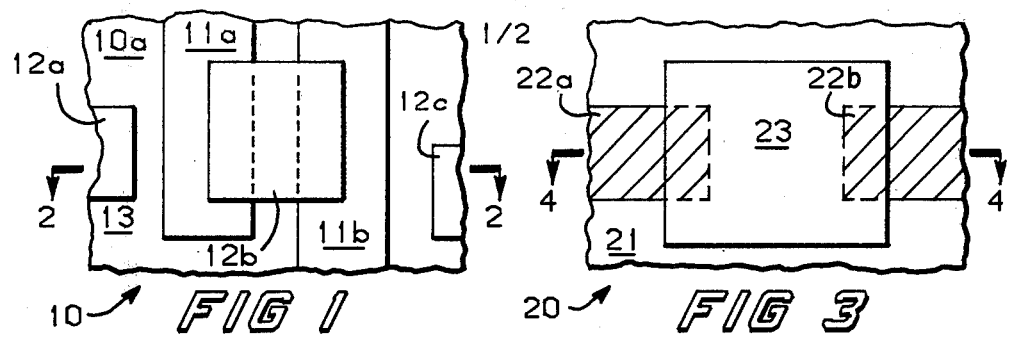
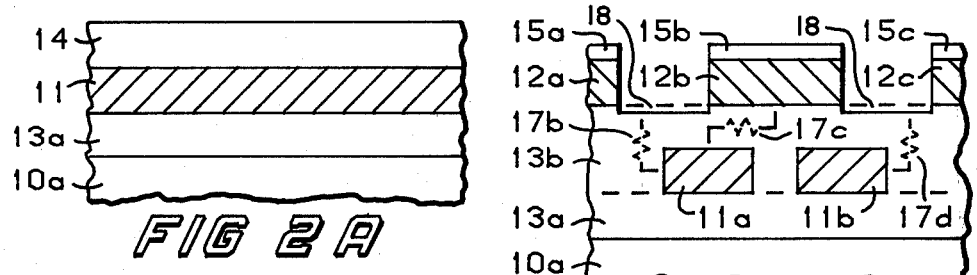
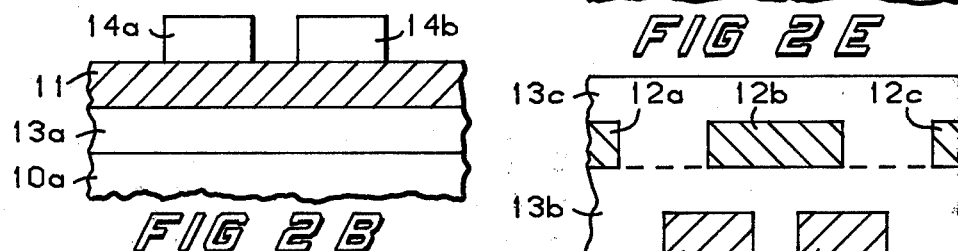
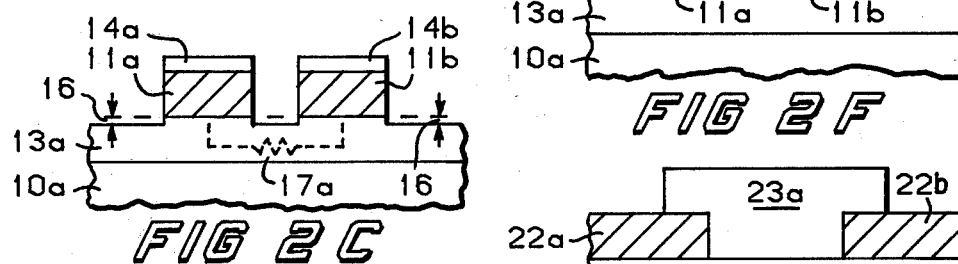
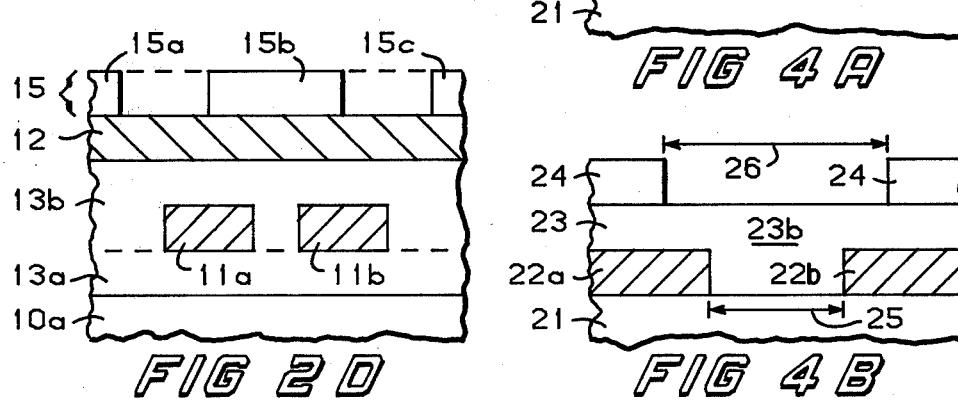

METHOD FOR CONTROLLING THE CONDUCTIVITY OF POLYIMIDE FILMS AND IMPROVED DEVICES UTILIZING THE METHOD

BACKGROUND OF THE INVENTION

1. Field of the Invention

This invention relates to, in general, methods for controlling the conductivity of polyimide and other polymer films, and more particularly, to methods for controlling the conductivity of polyimide and other polymer layers in electronic devices and to electronic devices using such layers.

2. Background Art

Organic polymer material layers are increasingly used in electronic devices. Polyimides, in particular, are of interest because of their favorable physical, chemical, and electrical properties, and the relative ease with which layers may be formed. Typical applications are, as an inter-layer insulating dielectric layer between different conductor layers, as a planarizing layer on uneven substrate surfaces to aid in smoothing out irregularities, as a masking layer, as a protective coating, or as a combination of the above where several functions may be performed by a single layer.

Ordinarily, polyimides are excellent insulating dielectrics. Volume resistivity is normally $10^{15}$–$10^{\neq}$ohm-cm, dissipation factor is about 0.002 at 1 kHz, and dielectric strength in thin (1 $\mu$m) layers is about $2 \times 10^8$ volts per meter. Additionally, polyimides show excellent thermal stability compared to most other plastics. They are able to withstand exposure to temperatures of 400°–450° C. in air for periods of several hours without measureable thermal decomposition.

Because of the high resistivity and low dissipation, the prior art applications of polyimides have been limited to those occasions where it was desired to have an insulating dielectric layer, since there was no known method for controllably varying the conductivity of substantially pure polyimides. A method has been discovered by which this may be accomplished, in that a layer of a polymer, such as a polyimide, which is normally an insulating dielectric can be made partially conducting, and then if desired, returned to an insulating or any intermediate state. Additionally, in another embodiment of this invention, certain fabrication techniques of great utility for the production of electronic devices can be utilized with polyimide and other polymer materials to produce layers having significant conductivity or to produce layers which are substantially as non-conducting as the original polymer material, so that electrical leakage may be induced or eliminated as desired.

Accordingly, it is an object of this invention to provide an improved method for the fabrication of electronic devices having a polymer layer therein, particularly a polyimide layer, in contact with one or more conductor regions.

It is a further object of this invention to provide an improved method for controlling the conductivity of polymer layers, e.g. polyimides, in electronic devices and other applications.

It is an additional object of this invention to provide a method for inducing significant conductivity in polymer layers, by exposure of such layers to energetic particles.

It is a further object of this invention to control or eliminate the conductivity present in polymer layers, following exposure to energetic particles, by subsequent heating of the layers.

It is an additional object of this invention to control or eliminate the conductivity present in polymer layers, following exposure to energetic particles, by subsequent exposure of such layers to a gaseous plasma.

It is a further object of this invention to provide an improved method for the fabrication of conductor-insulating dielectric layer structures, on a substrate utilizing polymer dielectric layers.

It is an additional object of this invention to control or eliminate the intra- and inter-layer conductivity which occurs in conductor-insulating dielectric structures using polyimides where the conductor pattern has been etched or formed by means of bombardment with energetic particles.

It is a further object of the present invention to provide an improved method for the fabrication of electronic devices wherein the same material layer serves as an insulating dielectric in one region and a partially conducting dielectric, e.g. a resistor, in another region.

It is an additional object of this invention to provide an improved method for stabilizing the partially conductive behavior induced in polymer layers.

It is a still further object of this invention to provide improved electronic devices made by the above methods.

SUMMARY OF THE INVENTION

In a first embodiment, a method is provided for preparing a structure which includes at least a first conductor, and optionally additional conductors, and an insulating dielectric on a substrate. A polymer layer, preferably a polyimide layer, having the property of becoming non-insulating when bombarded by or exposed to energetic particles is utilized. A conductor layer is formed in contact with the polymer layer and coated with a masking layer having a predetermined pattern of covered and non-covered portions. The conductor layer is etched to form the desired conductor pattern by bombarding the conductor layer with energetic particles through the non-covered portions of the masking layer until substantially all of the conductor layer material is removed in the non-covered portions. As the last of the conductor layer material is removed, the underlying polymer layer is briefly exposed, to the energetic particles, thereby rendering it non-insulating i.e. conducting. The portions of the polymer layer which have been rendered non-insulating by exposure to the energetic particles are returned to a substantially insulating state by thereafter (a) preferably exposing it briefly to a low energy gaseous plasma or (b) heating for a comparatively longer time, or (c) a combination thereof. A second conductor can be optionally provided overlying the first conductor by repeating the above sequence of steps. It is desirable that the low energy gaseous plasma contain oxidizing species.

In a second embodiment, an improved process for fabricating electronic devices utilizing a pattern of conductive regions in contact with a polymer layer, which has been exposed to energetic particles, is provided, whereby the conductivity induced in the polymer layer by exposure to the energetic particles is modified or removed by thereafter exposing part or all of the polymer layer to a low energy gaseous plasma.

In a third embodiment, an improved method is provided for fabricating regions of controlled conductivity in a polymer layer by bombarding portions of the polymer layer with or exposing them to a predetermined dose of energetic particles to render it conductive.

In a fourth embodiment, an improved method for making regions of controlled conductivity is provided wherein an organic polymer is first bombarded i a specific region with energetic particles to increase its conductivity to a value greater than the final desired value, and then subsequently exposed to a low energy gaseous plasma to reduce the conductivity to the final desired value, or heated to a predetermined temperature less than the thermal decomposition temperature of the polymer for a predetermined time to reduce the conductivity to the final desired value, or a combination thereof.

In the fifth embodiment, an improved method is provided for fabricating in a single layer of polymer material, a first region which is substantially insulating, and a second region which is substantially non-insulating by initially bombarding the polymer layer with energetic particles so as to substantially render it non-insulating throughout, then covering the layer with a masking layer containing apertures for exposing only those portions which are desired to be rendered substantially insulating, and thereafter exposing the non-covered portions to a low energy gaseous plasma. Alternatively, a substantially insulating polymer layer is formed, then covered with a masking layer having apertures corresponding to those regions where conductivity is desired, and thereafter exposing the polymer layer through the apertures to energetic particles to induce conductivity therein.

In a further embodiment, the above described methods may be supplemented by covering the device structures so formed with a protective coating so as to thereafter stabilize the conductivity of those regions of the polymer layer which have been subjected to bombardment by energetic particles and optionally exposed to a low energy gaseous plasma, heat, or a combination thereof.

Exposure to a low energy gaseous plasma to control or remove bombardment induced conductivity in polymer layers, particularly polyimides, is particularly advantageous because of the rapid action provided by the plasma and the absence of adverse side effects. This results in lower manufacturing costs and improved reliability.

BRIEF DESCRIPTION OF THE DRAWINGS

FIG. 1 shows a top view of a structure containing conductors and polymer dielectric insulators.

FIGS. 2A-F show a simplified cross section of FIG. 1 at various stages of manufacture.

FIG. 3 shows a top view, in simplified form, of a conductor and polymer dielectric structure in which a region of controlled conductivity has been provided.

FIGS. 4A-B show simplified cross sections of alternative embodiments of the structure of FIG. 3.

DETAILED DESCRIPTION OF THE DRAWINGS

Figure 5:
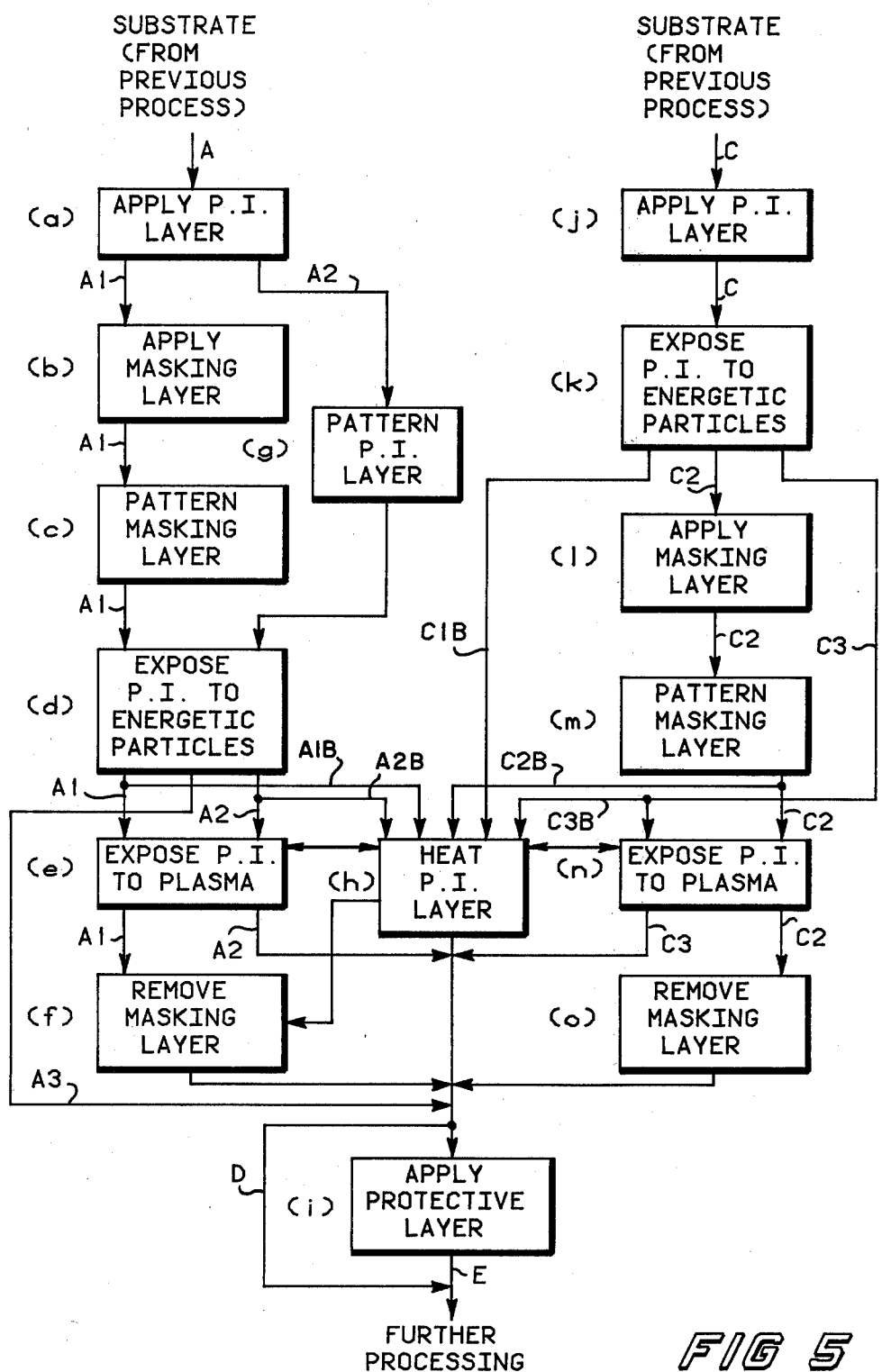
FIG. 5 shows various process sequences for producing regions of controlled conductivity in polymer films.

FIG. 1 is a top view of device portion 10 comprising substrate 10a, conductors 11a-b, and conductors 12a-c separated by polymer dielectric layers 13. Substrate 10a can be of any suitable material, for example, an insulator, a semi-insulator, a semiconductor, a conductor coated with one of the preceeding materials, or a combination thereof.

FIGS. 2A-F are cross sections of FIG. 1 during various stages of manufacture. In FIG. 2A substrate 10a has been coated with polymeric dielectric layer 13a, preferably a polyimide, first conductor layer 11, and masking layer 14. Masking layer 14 may consist of any convenient material suitable for acting as an etch mask for first conductor layer 11. Mask layer materials for this purpose are well known in the art. Photoresists are typical examples.

In FIG. 2B, mask layer 14 has been patterned to provide protective (covering) portions 14a-b on first conductor layer 11. In FIG. 2C, first conductor layer 11 has been etched to form first conductor portions 11a-b under mask portions 14a-b. Mask portions 14a-b are partly eroded during the etching of first conductor portions 11a-b. Bombardment with energetic particles has been found to be a convenient means of etching first conductor layer 11. It is not necessary that the energetic particles have great penetrating power; energies greater than 100 eV being sufficient and 500 eV being convenient. Bombardment etching techniques such as "ion-milling" are well known in the art and give satisfactory results. It will be apparent to those of skill in the art that masking layer 14 must have sufficient initial thickness so that covering portions 14a-b can withstand the eroding effects of the bombardment etching in order to protect first conductor portions 11a-b while the balance of first conductor layer 11 is etched away. This thickness varies with the thickness and composition of layers 11 and 14 and can be readily determined by experiment.

In the process of etching away those portions of first conductor layer 11 which are not protected by mask portions 14a-b, the corresponding underlying portions of polymer layer 13a are inevitably exposed to the bombardment etching process. In order to insure that those portions of first conductor layer 11 not protected by mask portions by 14a-b have been fully removed, it is desirable to over-etch slightly, in which case, surface portions 16 of layer 13a are also removed. Surface portions 16 are generally chosen to be as thin as possible, consistent with manufacturing convenience, and are usually of the order of a few hundred Angstroms ($10^{-8}$ m) in thickness. Following completion of the conductor etching step, protective portions 14a-b of mask layer 14 are removed by methods well known in the art.

Polyimide materials are particularly convenient for use as dielectric layer 13a. It has been found that when first conductor layer 11 is etched by means of bombardment with energetic particles, those portions of layer 13a which have been exposed to these energetic particles lose their normal property of being excellent insulators, and become conductive. Particle energies exceeding 100 eV are effective, with 500 eV being convenient, and 2000 eV being useful. This provides a current leakage path coupling first conductor portions 11a and 11b through the underlying portions of layer 13a. This leakage path is indicated on FIG. 2C as parasitic resistor 17a. As will be discussed in greater detail later, it has been discovered that the bombardment induced conductivity giving rise to parasitic resistance 17a can be removed by exposing the affected portions of layer 13a briefly to a low energy gaseous plasma, or by heating for a comparatively longer period of time, or by a combination thereof.

In FIG. 2D, protective portions 14a-b have been removed and the remaining structure of FIG. 2C coated with a second polymer layer 13b (preferably a polyimide), second conductor layer 12, and second masking layer 15 which has been patterned to provide protective portions 15a–c. In FIG. 2E the etching procedure described in connection with FIG. 2C is repeated so that protective mask portions 15a–c are used to define second conductor portions 12a–c. In the example of FIG. 1 and FIGS. 2A–F, substrate 10a, conductor portions 11a–b, and conductor portions 12a–c are separated from each other by portions 13a and 13b of dielectric polymer layers 13. The bombardment etching process of FIG. 2E removes surface portions 18 of layer 13b and causes those portions of layers 13b not protected by masked portions 15a–c to become significantly conductive. This bombardment induced conductivity gives rise to parasitic leakage shown schematically as resistances 17b, 17c, and 17d. These resistances can have values as low as $10^5$ ohms or less, as compared to resistances of $10^8$ ohms or higher without bombardment. Thus, the conductors of device 10 which would otherwise be nominally insulated, one from the other, are coupled by these parasitic resistances resulting from the etching process. The bombardment induced conductivity is not a transient phenomenon but persists after the etching process is completed. As is noted in connection with leakage resistance 17a of FIG. 2C, leakage resistances 17b–d may be removed, and layer 13b returned to its normal dielectric insulating state by exposing the structure briefly to a low energy gaseous plasma or heating for a comparatively longer period of time, or a combination thereof. It will be recognized by those of skill in the art that parasitic resistors 17a–d are merely illustrative of the many three dimensional leakage paths which can exist, as a result of the bombardment etching, in polymer layers 13a–b.

In FIG. 2F mask portions 15a–c have been removed and the conductors 12a–c protected by coating with an additional dielectric layer 13c. This dielectric layer may conveniently also be a polyimide.

While the bombardment induced conductivity effect may be undesirable in some structures, it can be used to advantage in other structures to provide localized resistors (i.e. conductive regions). It is not necessary that the bombardment be accompanied by or be incident to etching. This embodiment is illustrated in FIG. 3 and FIGS. 4A–B.

FIG. 3 illustrates device portion 20 comprising substrate 21, having an insulating surface, on which are placed conductor leads 22a–b and polymer region 23. The resistance between conductors 22a and 22b provided by polymer region 23 may be varied over a wide range by bombarding region 23 with energetic particles to increase its conductivity. Additional control may be obtained by carrying out the bombardment to a dose sufficient to provide a conductivity value higher than the final target value, and then subsequently exposing the bombarded region to a low energy gaseous plasma, to a heating step, or a combination thereof in order to trim the conductivity back to the target value.

FIGS. 4A–B are cross sections of the device portion of FIG. 3 showing alternative arrangements of the conductors and the polymer regions. In FIG. 4A, conductors 22a–b are formed on substrate 21 and locally coated with polymer region 23a having limited extent. The bombardment step and optional plasma and/or heat trimming steps may then be carried out without benefit of further masking operations. In alternative embodiment FIG. 4B, conductors 22a–b are formed on substrate 21 and substantially the entire substrate covered with polyimide layer 23b. Masking layer 24 having aperture 26 larger than separation 25 of conductors 22a–b is deposited over polymer layer 23b. Bombardment, optionally followed by plasma and/or heat trimming, then proceeds via aperture 26 so as to permit the conductivity of portion 23b of layer 23 lying beneath aperture 26 to be adjusted in a controlled manner.

FIG. 5 illustrates various process sequences which are followed in producing regions of controlled conductivity in polymer films. The process sequences described in FIG. 5 are concerned with the creation, adjustment, and stabilization of controlled conductivity regions in the polymer layer. It will be recognized by those of skill in the art that the conductor patterns necessary to make contact to the appropriate regions of the polymer layer may be applied before, during, or after the process sequences illustrated in FIG. 5, prior to application of a protective layer (step i).

Process flow (A) of FIG. 5 begins in step (a) with the application of a polymer layer to a substrate. The process sequence will be illustrated for the case of a polyimide (PI) as the polymer. According to flow (A1), a masking layer is applied in step (b), patterned in step (c), and the combination of masking and polyimide layer exposed to energetic particles in step (d). The polyimide layer is typically applied (step (a)) by placing a small drop of the polyimide dissolved in a solvent upon the substrate and then rapidly spinning the substrate in order to spread the drop into an even coating. The PI layer is then baked to remove volatile constituents, typically for 120 minutes at 350° C. in an inert ambient. Polyimide materials manufactured by DuPont of Wilmington, Del., as type PI-2555 or PI-2560 are suitable. DuPont type T9035 N-methyl-2-pyrrolidone is a useful carrier solvent in the proportions 25–75% type PI-2560 polyimide to 75–25% solvent by volume, or 50–90% type PI-2555 polyimide to 50–10% solvent by volume. Other polyimide materials and solvents can also be used. The polyimide layer thicknesses is conveniently in the range from a few hundred Angstroms ($10^{-8}$ m) to 10,000 or more Angstroms ($10^{-8}$ m) depending upon the final value of resistance desired and the conductivity (or resistivity) achieved as a result of bombardment and subsequent steps. The appropriate values may be readily determined by experiment. Methods of applying and patterning masking layers are well known in the art. Standard photoresists having thicknesses of the order of a few thousand Angstroms ($10^{-8}$ m) have been found to give satisfactory results as masking layers. Only those portions of the polyimide layer showing through the apertures in the masking layer are exposed to the energetic particles in step (d).

An alternative means of determining the shape and extent of the polyimide region which undergoes conductivity variation as a result of exposure to energetic particles in step (d), is to follow flow (A2) in which the polyimide layer is patterned in step (g) to leave behind only those portions of the polyimide layer which it is desired to render conductive. Once the appropriate portions of the polyimide layer have been rendered partially conductive in step (d), then at least five subsequent process flow possibilities exist. The substrates may be removed after step (d) for further processing (flow A3), they may be sent on to step (e) wherein the bombarded polyimide layer is exposed to a low energy gaseous plasma to reduce the conductivity to a final desired value (flows A1 and A2), or the exposed polyimide layer may be heated as in step (h) (flows A1B and A2B) as an alternative means of trimming the conductivity to a final value, or a combination thereof. Following steps (d), (e), or (h), any remaining portions of the masking layer may optionally be removed as in step (f), and/or the conductive portions of the polyimide layer can be optionally coated with a protective layer, as in step (i), so as to stabilize the conductivity values against further changes during subsequent processing or use. Polyimide has been found to be an effective protective layer material.

An alternative process flow for achieving similar results is presented in flow (C) of FIG. 5. The substrate is coated with a polyimide layer in step (j) and then uniformly exposed to energetic particles in step (k) to increase the conductivity. Following step (k), according to flow (C2), a masking layer is applied in step (1) and patterned in step (m), prior to trimming the conductivity by exposing the polyimide layer to a low energy gaseous plasma in step (n). Flows (C1B) and (C2B) show that the bombardment induced conductivity can be alternatively trimmed using heat as in step (h). Where it is desirable that masking be avoided, flow (C3) is followed subsequent to step (k) with the alternative of exposing the polyimide to a gaseous plasma in step (n) or (flow C3B) heating as in step (h). A combination of heating and plasma exposure could also be used. Where a masking layer has been used, it is removed in steps (f) or (o). The substrates may be passed directly to further processing (flow D) or via step (i) in which a protective layer is applied to stabilize the conductivity against further change. A suitable protective layer material for use in step (i) is another coating of polyimide. While the process flows illustrated in FIG. 5 offer a number of different alternatives, they are not exhaustive, and it will be readily apparent to those with skill in the art that modifications may be made in the illustrated flows without deviating from the intent of the present invention.

The processes and structures described in connection with FIGS. 1, 2A-F, 3, 4A-B, and 5 have been applied to the manufacture of magnetic bubble memory devices. In a typical example, an insulating substrate (e.g. a garnet or oxide covered garnet) was coated with a polyimide (to serve as polymer layer 13a) of thickness in the range of 0.01 to 1.0 $\mu$m, with 0.1 $\mu$m being a convenient value. A metal layer of thickness in the range 0.1 to 1.0 $\mu$m, with 0.35 $\mu$m being a convenient value, was deposited over polyimide layer 13a to form conductor layer 11. Polymer layer 13b, also of polyimide, was 0.01 to 2.0 $\mu$m thick, with 0.4 $\mu$m being a convenient value. Conductor layer 12 was formed from a metal layer of 0.1 to 1.0 $\mu$m thickness, with 0.35 $\mu$m being a convenient value. Layer 11 was typically a sandwich of Cr/Cu/Cr and layer 12 was typically a Ni-Fe alloy.

A conventional photoresist was applied to metal layers 11 and/or 12 and patterned using techniques well known in the art. A commercial ion milling system (Veeco Microetch 10) utilizing argon gas and operating at typically 500 eV and 0.5 mA/cm$^2$ current density was used to etch the metal layer exposed in the apertures in the photoresist masking layer. A Commonwealth Scientific Millatron VIII-C has also been used with good results. Other forms of bombardment etching or bombardment enhanced etching such as sputter etching and reactive ion etching are also believed to be effective. Bombardment energies in the range 100 eV to 2000 eV are useful. A 10% over-etch was used in order to insure that the surface portions exposed through the openings in the masking layer were fully cleared of metal across the entire substrate. For example, surface portion 16 was about 10% of the thickness of layer 13a. It was found that the metal islands (e.g. 11a-b and 12a-c) produced by this technique were not electrically isolated one from the other as would be expected based upon the normal high resistivity of both the garnet substrate and the polyimide materials. It was determined that the parasitic conductivity (leakage resistance) was present in the polyimide layer and that it was directly related to the exposure of the polyimide layer between the metal islands to the energetic particles in the ion milling bombardment etching step. While precise values for the resistivity (or conductivity) change following bombardment could not be measured, it is estimated that the conductivity had increased by a factor of $10^3$ to $10^9$ over its nominal value prior to exposure to the energetic particles during etching.

The bombardment induced conductivity was found to decay slowly if the samples were left exposed to the air, decreasing by a factor of $10^3$ or more after several weeks of exposure. Conversely, if a protective coating was placed over the layers, the conductivity did not decrease, even when experiments were extended over periods of several months. The bombardment induced conductivity was substantially removed by heating the layers to 220° C. for 5 hours or 250° C. for 2 hours in an inert ambient. Annealing for shorter times and at lower temperatures could be used to produce any desirable intermediate value of conductivity (or resistivity).

To shorten the annealing time, higher temperatures are used since annealing time decreases as temperature increases. At high temperatures (e.g. above 350° C. to 450° C.) deterioration of both the metal layers and the polymer can become significant. This is an undesirable side effect. Thus, there is a practical limit on the minimum annealing time which can be achieved through increasing the annealing temperature.

It was discovered that exposing the bombarded polyimide layers to a low energy gaseous plasma, particularly plasmas containing oxygen, would produce a very rapid decrease in the conductivity, restoring the layers to substantially their pre-bombardment characteristics in a comparatively short time. For example, polyimide films of the order of 1 $\mu$m or less in thickness were restored to their pre-bombardment characteristics following an exposure time of approximately 30 seconds carried out in a Tegal Plasmaline Asher operating at 300 watts at a pressure of 1 Torr (0.13 kP) in oxygen. This is an unexpected result. This rapid action is a significant advantage since it substantially shortens manufacturing time and permits pre-bombardment conductivity values to be restored without extensive heating of the device to high temperatures which might otherwise be required to achieve the same conductivity levels in a reasonable time span. The time saving leads to lower manufacturing costs, and the lower treatment temperature avoids thermal deterioration of either the metal and/or the polymer layers which would adversely affect reliability.

When multi-layer metal structure of the sort illustrated in FIGS. 1 and 2A-F and discussed above were constructed using bombardment etching with argon particles having a minimum energy of 100 eV, typically 500 eV, substantial electrical leakage was found to exist between normally isolated conductor portions as a result of the etching of the polyimide layers. Argon was found to be a convenient gas for use in the bombardment etching step, but other inert gases, reactive gases, and/or mixtures thereof are also useful. This enhanced leakage resistance effect could be entirely avoided by giving the samples a 30 second exposure in the Tegal Plasmaline Asher at a pressure of 1 Torr and a power level of 300 watts in pure oxygen following each metal etching step.

It is expected, in general, that the effectiveness of the low energy plasma in lowering the bombardment induced conductivity is increased as the power level and the plasma pressure is increased and decreased as the time is decreased. Conversely, operating at lower power levels is expected to slow down the reaction which reduces the bombardment induced conductivity, thus making it easier to trim the conductivity to a final predetermined value rather than to remove it entirely. Heating the samples during exposure to the low energy plasma, that is, combining the two means for reducing the conductivity and/or restoring the polymer layers to their pre-bombardment condition is also useful.

Changing the gas mixture in the low energy plasma also has an effect on the degree and rate of removal of the bombardment induced conductivity. Pure oxygen is most effective and acts very quickly. Air is also effective. A mixture of $CF_4 + 8\%$ $O_2$ acts more slowly and provides more control over the degree and rate of reduction in the conductivity.

Increases in conductivity of inorganic materials during bombardment with very energetic particles, i.e. ions or atoms of energy above 10 keV, are known. Typical energies are of the order of 100 keV. In the case of semiconductors, the enhanced conductivity can persist after exposure ceases. However, it was not previously known that persistent enhancement of conductivity is provided in polymers by bombardment with much lower energy particles, e.g. argon atoms or ions having energies as low as 100 eV, and general below a few keV. Even more surprising and unexpected is the discovery that exposure to a low energy plasma can substantially reduce or remove the bombardment induced conductivity. The exact mechanism by which the low energy plasma reduces the bombardment induced conductivity is not known.

The atoms and ions within the low energy plasma are excited to energies, typically within range 0.1-50 eV, with the majority having energies below about 10 eV. Those particles located near the surface of substrates placed in the plasma, will typically have energies of a few electron-volts or less. Meta-stable excited species also exist in the plasma which may promote chemical reactions having a tendency to repair dangling bonds or other defects produced by the bombardment process inducing conductivity. Whatever the mechanisms for inducement and annealing of the enhanced conductivity, the energy of the particles involved is believed to be significant, that is, bombardment induced conductivity being created by particle with energies exceeding about 100 eV, and annealing of the induced conductivity being produced by exposure to a low energy plasma in which the majority of particles have energies less than 50 eV, typically less than 10 eV. Accordingly, as used herein, "energetic particles" refers to particles (atoms, ions, or molecules) having energy above 100 eV, and "low energy plasma" refers to gaseous plasmas with a mean particle energy, in the vicinity of the device surface, of less than 50 eV.

While the process has been illustrated by use of polyimide layers, it is believed that bombardment induced conductivity and low energy plasma annealing effects may be found in other materials as well, and that the invented processes described herein are not restricted solely to polyimides. Accordingly, it is intended to include such other materials as well as such other variations as will be apparent to those with skill in the art which fall within the spirit and scope of the present invention.

There has been provided by the present invention an improved method for preparing a structure having a conductor and an insulating polymeric dielectric material, such as a polyimide, on a substrate. The improved method avoids parasitic leakage resistance induced in the dielectric material as a result of etching steps involving exposure to energetic particles, and comprises exposing the bombarded polymeric layers briefly to a low energy gaseous plasma or for longer periods to heat (or a combination thereof), both of which act to decrease and, optionally, remove the bombardment induced conductivity in the polymeric layers. There has been further provided an improved process for fabricating regions of controlled conductivity in polymeric layers, particularly polyimides, by exposing such polymeric layers, selectively, to energetic particles of an energy greater than 100 eV to produce bombardment induced conductivity, and then, optionally, trimming such induced conductivity to a final desired value by subsequent heating or exposure to a low energy gaseous plasma or a combination thereof.

While the present invention has been described in terms of particular device structures and materials it will be apparent to those of skill in the art that the concepts apply to a wide range of devices and structures, as for example, semiconductor devices, Josephson devices, opto-devices, sensors, resistors, capacitors, device interconnects, and the like, and can employ other materials having generally similar properties. Accordingly, it is intended to encompass all such variations which fall within the spirit and scope of the present invention.

I claim:

1. A method for preparing a structure which includes a conductor and an insulating dielectric on a substrate, comprising:

depositing a polymer layer to a predetermined thickness on said substrate, said polymer layer having the property of becoming substantially non-insulating when exposed to energetic particles;

forming on said polymer layer a conductor layer;

creating on said conductor layer a pattern determining layer to provide a covered portion and a non-covered portion of said conductor layer;

etching said non-covered portion of said conductor layer by exposure to said energetic particles, to form said conductor;

continuing until substantially all said conductor layer in said non-covered portion is removed and an underlying region of said polymer layer is exposed to said energetic particles and thereby rendered substantially non-insulating; and exposing thereafter said region of said polymer layer to a low energy gaseous plasma to return said polymer layer to a substantially insulating state to form said insulating dielectric.

2. A method for preparing a structure which includes a first and second conductor and an insulating dielectric on a substrate, comprising depositing a first polymer layer to a first predetermined thickness on said substrate, said first polymer layer having the property of becoming substantially non-insulating when exposed to energetic particles;

forming on said first polymer layer a first conductor layer;

creating on said first conductor layer a first pattern determining layer to provide a first covered portion and a first non-covered portion of said first conductor layer;

etching said first non-covered portion of said first conductor layer by exposure to said energetic particles to form said first conductor;

continuing until substantially all said first conductor layer in said first non-covered portion is removed and an underlying first region of said first polymer layer is exposed to said energetic particles and thereby rendered substantially non-insulating;

exposing thereafter said first region of said first polymer layer to a low energy gaseous plasma to return said first polymer layer to a substantially insulating state to form a first part of said insulating dielectric;

depositing a second polymer layer to a second predetermined thickness on said substrate, said second polymer layer having the property of becoming substantially non-insulating when exposed to said energetic particles;

forming on said second polymer layer a second conductor layer;

creating on said second conductor layer a second pattern determining layer to provide a second covered portion and a second non-covered portion of said second conductor layer;

etching said second non-covered portion of said second conductor layer by exposure to said energetic particles to form said second conductor;

continuing until substantially all said second conductor layer in said second non-covered portion is removed and an underlying second region of said second polymer layer is exposed to said energetic particles and thereby rendered substantially non-insulating; and exposing thereafter said second region of said second polymer layer to a low energy gaseous plasma to return said second polymer layer to a substantially insulating state to form a second part of said insulating dielectric.

3. The method of claims 1 or 2 wherein said polymer comprises a polyimide, and said etching step comprises ion milling.

4. The method of claim 1 or 2 wherein said low energy gaseous plasma contains oxidizing species.

5. In a process for fabricating electronic devices utilizing a pattern of conductor regions in contact with a polymer layer, wherein portions of said polymer layer have been exposed to energetic particles, the improvement comprising, thereafter exposing said portions of said polymer layer to a low energy gaseous plasma.

6. In a process for fabricating electronic devices utilizing a pattern of conductor regions in contact with a polymer layer, wherein portions of said polymer layer have been exposed to energetic particles during an etching step, the improvement comprising, thereafter exposing said portions of said polymer layer to a low energy gaseous plasma.

7. In a process for fabricating electronic devices utilizing a substantially non-conductive polymer layer, wherein at least portions of said polymer layer have been exposed to energetic particles and rendered partially conductive, the improvement comprising: exposing at least some of said portions of said polymer layer to a low energy gaseous plasma to restore some of said portions to a substantially non-conductive state.

8. The process of claim 5, 6 or 7 wherein said polymer comprises a polyimide.

9. The process of claim 5, 6, or 7 wherein said low energy gaseous plasma contains oxidizing species.

10. The process of claim 5, 6, or 7 wherein at least one of said electronic devices is a magnetic bubble memory device.

11. The process of claim 5, 6, or 7 wherein exposure to energetic particles takes place during ion milling.

12. A method for making a partially conducting region on a substrate, comprising, creating a polymer layer on said substrate, and bombarding a portion of said polymer layer with a predetermined dose of energetic particles to form said partially conducting region, wherein said energetic particles have an energy in the range 100 to 2000 eV.

13. A method for making a partially conducting region of a predetermined value of conductivity on a substrate, comprising:

forming a polymer layer on said substrate to a predetermined thickness;

bombarding a portion of said polymer layer with a predetermined dose of energetic particles to form, in said polymer layer, a partially conducting region having a conductivity greater than said predetermined value; and exposing at least a part of said region to a low energy gaseous plasma for a predetermined time to reduce said conductivity to said predetermined value.

14. The method of claim 13 wherein said low energy gaseous plasma contains oxidizing species.

15. A method for making a partially conducting region of a predetermined value of conductivity on a substrate, comprising:

forming a polymer layer on said substrate to a predetermined thickness;

bombarding a portion of said polymer layer with a predetermined dose of energetic particles to form, in said polymer layer, a partially conducting region having a conductivity greater than said predetermined value; and heating said region to a predetermined temperature less than a thermal decomposition temperature for said polymer for a predetermined time, to reduce said conductivity to said predetermined value.

16. A method for making, on a substrate, a layer having conducting and non-conducting portions, comprising:

forming a polymer layer on said substrate;

bombarding said polymer layer with energetic particles to induce conductivity in substantially the entire lateral extent of said polymer layer;

covering said polymer layer with a masking layer which is substantially impervious to a low energy gaseous plasma, and containing an aperture portion where conductivity is not desired and a blocking portion where conductivity is desired; and exposing said covered polymer layer to a low energy gaseous plasma to substantially remove conductivity in said polymer layer in said aperture portions.

17. The method of claim 16 wherein said low energy gaseous plasma contains oxidizing species.

18. A method for making, on a substrate a layer having conducting and non-conducting portions, comprising:

forming a polymer layer on said substrate to a predetermined thickness;

covering said polymer layer with a masking layer substantially impervious to energetic particles and having apertures where conductivity is desired in said polymer layer and blocking portions where conductivity is not desired in said polymer layer; and bombarding said polymer layer with energetic particles through said apertures to induce conductivity therein.

19. The method of claim 12, 13, 14, 15, 16, 17 or 18 further comprising thereafter applying a protective coating.

20. The method of claim 12, 13, 14, 15, 16, 17, or 18 wherein said polymer comprises a polyimide.

* * * * *